(12) United States Patent
Rehner

(10) Patent No.: US 11,639,977 B2
(45) Date of Patent: May 2, 2023

(54) LOCAL COIL FOR MAGNETIC RESONANCE IMAGING

(71) Applicant: Siemens Healthcare GmbH, Erlangen (DE)

(72) Inventor: Robert Rehner, Neunkirchen am Brand (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/525,128

(22) Filed: Nov. 12, 2021

(65) Prior Publication Data

US 2022/0179019 A1 Jun. 9, 2022

(30) Foreign Application Priority Data

Dec. 3, 2020 (DE) ...................... 10 2020 215 318.3

(51) Int. Cl.
*G01R 33/36* (2006.01)
*H01B 11/18* (2006.01)

(52) U.S. Cl.
CPC ..... *G01R 33/3628* (2013.01); *H01B 11/1808* (2013.01)

(58) Field of Classification Search
CPC .......... G01R 33/3628; G01R 33/34084; G01R 33/34007; G01R 33/3657; G01R 33/341; H01B 11/1808; H01B 11/1895
See application file for complete search history.

(56) References Cited

U.S. PATENT DOCUMENTS 4,775,837 A * 10/1988 Roschmann ....... G01R 33/3628
324/318

| | | | |
|---|---|---|---|
| 2004/0217761 A1* | 11/2004 | Wong | G01R 33/34053 324/318 |
| 2010/0060283 A1 | 3/2010 | Findeklee et al. | |
| 2013/0137969 A1* | 5/2013 | Jones | A61B 5/055 600/421 |
| 2014/0197832 A1* | 7/2014 | Driesel | H01Q 7/005 324/322 |
| 2019/0235034 A1* | 8/2019 | Greim | G01R 33/3415 |

OTHER PUBLICATIONS

German Office Action for German Application No. 10 2020 215 318.3 dated Aug. 31, 2021.
Malzacher, Matthias. "Simulation and development of RF resonators for preclinical and clinical 1H and X-nuclei MRI." PhD diss., 2019. pp. 1-110.
Ruytenberg, Thomas, Andrew Webb, and Irena Zivkovic. "Shielded-coaxial-cable coils as receive and transceive array elements for 7T human MRI." Magnetic resonance in medicine 83, No. 3 (2020): 1135-1146.

* cited by examiner

*Primary Examiner* — G.M. A Hyder
(74) *Attorney, Agent, or Firm* — Lempia Summerfield Katz LLC

(57) ABSTRACT

A local coil for magnetic resonance imaging is disclosed herein. The local coil includes an electrical circuit arrangement and a coaxial cable with an internal conductor and an external conductor surrounding the internal conductor. The two ends of the coaxial cable are connected to the electrical circuit arrangement and the internal conductor and the external conductor together form an antenna loop. The internal conductor and/or the external conductor has at least one interruption and the at least one interruption divides the internal conductor and/or the external conductor into at least two separate segments in each case.

15 Claims, 4 Drawing Sheets

LOCAL COIL FOR MAGNETIC RESONANCE IMAGING

The present patent document claims the benefit of German Patent Application No. 10 2020 215 318.3, filed Dec. 3, 2020, which is hereby incorporated by reference in its entirety.

TECHNICAL FIELD

The disclosure relates to a local coil for magnetic resonance imaging, including an electrical circuit arrangement and a coaxial cable with an internal conductor and an external conductor surrounding the internal conductor.

BACKGROUND

In order to achieve optimum image quality in the case of examinations using magnetic resonance imaging, local coils may be arranged as closely as possible to a body part of the patient to be examined. In addition to local coils arranged in a rigid housing and designed for imaging at a specific body part, (e.g., a head or a knee), flexible local coils are also available which may be molded to the respective body part to be examined. In order to achieve optimum moldability, the electronic components in the coil are mechanically flexible and/or the rigid components are as small as possible in order to produce a local coil with maximum overall flexibility.

To this end, it is customary to embody the antenna of the local coil as a flexible printed circuit board. The antenna of the local coil, which antenna is used to receive the signals during the imaging, may include copper tracks that are deposited on a thin and flexible substrate of, e.g., less than 100 μm in thickness in order to form the local coil. Further components may also be arranged on the substrate, wherein the further components are used, e.g., to adapt the resonance of the antenna according to the frequency of the magnetic resonance imaging. Rigid components such as SMD capacitors may be used for this purpose, thereby restricting the flexibility of the substrate.

However, the use of a flexible substrate has the disadvantage that the antenna may only be bent uniformly along one axis of the substrate, and therefore three-dimensional molding of the local coil to a body part which curves along a plurality of axes, such as a protruding belly or similar, is only possible to a limited extent. There is moreover the danger that the copper conductor tracks forming the antenna become detached from the substrate or break in the case of very small bend radii or a large number of different axes about which the flexible substrate is bent. Rigid electronic components such as the SMD capacitors, which are integrated in the local coil, may also be damaged as a result of a bending procedure. It is moreover also desirable for the local coil to be heated as little as possible by the transmission power that is radiated by further coils of the magnetic resonance imaging facility during magnetic resonance imaging.

SUMMARY AND DESCRIPTION

The object of the disclosure is therefore to provide an improved local coil. The scope of the present disclosure is defined solely by the appended claims and is not affected to any degree by the statements within this summary. The present embodiments may obviate one or more of the drawbacks or limitations in the related art.

In order to achieve this objective, with regard to a local coil of the type cited in the introduction, the two ends of the coaxial cable are connected to the electrical circuit arrangement and the internal conductor and the external conductor jointly form an antenna loop, wherein the internal conductor and/or the external conductor has at least one interruption and the at least one interruption divides the internal conductor and/or the external conductor into at least two separate segments in each case.

The use of a coaxial cable as an antenna or coaxial antenna of the local coil has the advantage that the coaxial cable is very flexible and may be bent in all spatial directions when configuring an antenna loop. In particular, bending about a plurality of axes and bends having small bend radii are possible in this case without fear of damaging the coaxial cable or the antenna loop. The antenna loop, which forms the main component of the local coil, may therefore easily be molded to the body of the patient.

It is advantageous that only one rigid section is required per antenna element in the local coil, the electrical circuit arrangement being arranged therein. The electrical circuit arrangement may be arranged on a rigid support element and/or have a housing. The electrical circuit arrangement may include two connection interfaces of the antenna. The electrical circuit arrangement may also include a preamplifier and/or further electrical components as explained in greater detail below.

The electrical circuit arrangement is connected to the two ends of the coaxial cable such that the coaxial cable forms an antenna loop electrically. In this case, the connection of the electrical circuit arrangement to the two ends of the coaxial cable may be effected in such a way that the coaxial cable also forms a substantially annular loop geometrically. Alternatively, other shapes of the antenna loop are also conceivable.

The internal conductor and the external conductor of the coaxial cable are electrically separated from each other by an insulator, or a dielectric arranged between the internal conductor and the external conductor surrounding the internal conductor. As a result of providing the at least one interruption in the internal conductor and/or the external conductor, a capacitance or integrated capacitor is produced in the antenna loop because an electrical connection of the then separate segments of the internal conductor and/or of the external conductor may only take place via the dielectric and the respective other conductor.

For example, an interruption in the internal conductor which divides the internal conductor into two separate segments therefore results in a first capacitance as a first integrated capacitor between the first internal conductor segment and the external conductor surrounding both segments of the internal conductor, and a second capacitance as a second integrated capacitor between the external conductor and the second segment of the internal conductor. Correspondingly, an interruption of the external conductor results in a first capacitance between the first segment of the external conductor and the internal conductor surrounded by both segments of the external conductor, and a second capacitance between the internal conductor and the second segment of the external conductor.

As a result of providing a plurality of interruptions, it is also possible to produce more than two capacitances or integrated capacitors, wherein the internal conductor and/or the external conductor may also each be divided into more than two separate segments. In this case, at least one segment of the external conductor may at least partly surround two segments of the internal conductor in each case and/or for at least one segment of the internal conductor to be surrounded at least partly by two segments of the external conductor.

As a result of providing the at least one interruption in the internal conductor and/or the external conductor of the coaxial cable, two or more capacitances of the antenna loop may be configured which electrically shorten a length of the antenna loop. It thereby becomes advantageously possible to adapt the antenna loop formed by the coaxial cable to the frequency of the magnetic resonance imaging, so that the antenna loop is also resonant at the frequency of the magnetic resonance imaging and may be deployed for the purpose of receiving the signals in the local coil for evaluation. The value of the capacitances that are formed may be influenced in each case by the number of interruptions and/or by the position of the interruptions along the coaxial cable, thereby allowing adaptation to a predetermined frequency or a predetermined magnetic field strength that is used for the imaging.

The internal conductor and the external conductor may each have one or a plurality of interruptions, the number of interruptions of the internal conductor and the number of interruptions of the external conductor being equal or differing by one. In particular, the interruptions in this case are arranged alternately along the length of the coaxial cable.

The use of an equal number of interruptions in the internal conductor and/or the external conductor, or the use of a number of interruptions in the internal conductor and the external conductor which differs by one, makes it possible to fully utilize all of the capacitances formed by the interruptions in the antenna loop because the transitions between the individual segments of the internal conductor and the external conductor may be deployed in each case for the purpose of configuring the AC circuit of the antenna loop.

The electrical AC circuit may be closed by the circuit arrangement by connecting the internal conductor or the external conductor at the first end of the coaxial cable to the internal conductor or the external conductor at the second end of the coaxial cable. If there is an odd number of interruptions, the electrical circuit arrangement may in this case make a connection at both ends of the internal conductor or at both ends of the external conductor, and if there is an even number of interruptions, a connection may be made at one end of the internal conductor and at the other end of the external conductor via the electrical circuit arrangement.

The external conductor and the internal conductor may have in total 1 to 10 interruptions, e.g., 3 to 5 interruptions.

In an embodiment, sections of the coaxial cable between the electrical circuit arrangement and the at least one adjacent interruption, and/or for the section or sections of the coaxial cable between two adjacent interruptions, may be at least substantially equal in length. This has the advantageous effect that the antenna loop is symmetrically loaded when receiving signals that are to be evaluated for the imaging, and therefore as a result of in particular uniformly distributed electrical fields, a symmetrical current distribution occurs during the reception. The antenna loop formed by the coaxial cable is able to receive not only the signals that are to be evaluated for the purpose of the imaging, but also excitation signals that are generated during the imaging. The excitation signals may be generated, e.g., by the field of a body coil in a transmit phase (TX phase). In the case of a local coil with a single interruption, the two sections being of at least substantially equal length means that the interruption is arranged opposite the electrical circuit arrangement and therefore the region of the interruption only has a slight influence on the flexibility of the coaxial cable.

In an embodiment, a sheath of the coaxial cable may be interrupted in the region of an interruption of the external conductor, the end sections of the segments of the external conductor created by the interruption of the external conductor being surrounded by an insulation material in the region of the interruption of the sheath. As a result of interrupting the sheath which surrounds the internal conductor and the external conductor and forms the exterior of the coaxial cable, the external conductor of the coaxial cable may be exposed. A separation of the external conductor may therefore be effected in the region of the interruption of the external conductor when the local coil is manufactured, such that the end sections of the now adjacent segments of the external conductor are exposed in the region of the interruption of the sheath. The region of the interruption may then be surrounded by an insulation material, (e.g., a heat-shrinkable tube), such that the exposed end sections of the segments of the external conductor are also insulated. This allows an interruption of the external conductor to be created easily during manufacture of the local coil.

In the region of an interruption of the internal conductor, the adjacent end sections of the segments of the internal conductor may be created by the interruption of the internal conductor to run at least sectionally parallel, those sections of the external conductor which surround these segments being electrically connected. Because the internal conductor of the coaxial cable is surrounded by the external conductor, it is not easy to create an interruption of the internal conductor while simultaneously keeping the external conductor intact. By configuring the local coil in such a way that the adjacent end sections of the segments created by the interruption of the internal conductor run parallel, it is possible when manufacturing the local coil to separate the whole coaxial cable, (e.g., the internal conductor, the dielectric, the external conductor, and the sheath), at the position of the interruption of the internal conductor, wherein the resulting end regions of the coaxial cable are placed next to each other so that the end sections of the internal conductor segments run parallel. In this region, the segments of the external conductor surrounding the internal conductor, or of the external conductor segments surrounding the segments of the internal conductor, are electrically connected in order to repair the interruption of the external conductor that was caused during manufacture.

The electrical connection between the sections of the external conductor surrounding the segments of the internal conductor may be made by soldering, for example. The whole region around the interruption may then be surrounded by an insulation material, (e.g., a heat-shrinkable tube), in order to effect an electrical insulation of in particular the external conductor and the end sections of the segments of the internal conductor created by the interruption of the internal conductor. In this arrangement, the end sections of the internal conductor may advantageously be arranged far enough from the external conductor that there is no risk of short circuit. By virtue of this configuration of the internal conductor, it is also advantageously possible to provide that the flexibility of the coaxial cable is only compromised slightly in the region of the interruption of the internal conductor, so that the adaptability and/or flexibility of the coaxial cable or local coil may be maintained.

In another embodiment, after severing the coaxial cable, the two end sections of the coaxial cable may be attached to a support element, (e.g., a printed circuit board), and the external conductors may be electrically reconnected with the aid of the printed circuit board. This arrangement however has the disadvantage of being mechanically less flexible in the region of the interruption of the internal conductor due to the additional support element.

The electrical circuit arrangement may have at least one detuning circuit connected to the internal conductor and/or the external conductor at the ends of the coaxial cable. The detuning circuit in this case allows the antenna loop to be detuned during transmission by a body coil of a magnetic resonance imaging facility, for example, so that the antenna loop has no influence or at least only slight interfering influence on the excitation by the body coil. Furthermore, the deployment of the detuning circuit makes it possible to reduce that portion of the transmit power of the body coil which couples into the antenna loop, because the resonance frequency of the antenna loop changes significantly as a result of the detuning circuit when the excitation signal is received.

The arrangement of the detuning circuit between the ends of the coaxial cable in such a way that the detuning circuit is connected to the internal conductor and/or the external conductor allows an efficient arrangement of the detuning circuit in the local coil. Measurements have shown that during a transmit phase of a body coil using this arrangement, comparatively little heat is generated in the detuning circuit as a result of a high-frequency alternating current induced in the antenna loop, such that the components of the detuning circuit may advantageously be smaller.

The arrangement of the detuning circuit may advantageously provide that when the antenna loop is detuned by the detuning circuit, a current induced in the antenna loop is also carried by the internal conductor and the external conductor of the coaxial cable, and therefore any heating caused by this current may be distributed over the whole local coil. If the detuning circuit was arranged parallel to a capacitance, the induced current would flow primarily through the parallel connection composed of capacitance and detuning circuit, these forming, e.g., a parallel resonant circuit, so that the detuning circuit would heat up more significantly. By arranging the detuning circuit between the ends of the coaxial cable, it is therefore possible to provide that the electrical circuit arrangement or a housing surrounding the electrical circuit arrangement heats up less, such as during a transmit phase of a body coil of the magnetic resonance imaging facility.

The arrangement of the detuning circuit between the ends of the coaxial cable has the further advantage that, as a result of the reduced heating of the detuning circuit, the electrical circuit arrangement may also be smaller and therefore the region of the electrical circuit arrangement, (e.g., a rigid support element holding the electrical circuit arrangement and/or a rigid housing surrounding the electrical circuit arrangement), may likewise be smaller, whereby the flexibility of the local coil may be further improved. Furthermore, by virtue of their arrangement as part of the electrical circuit arrangement, the components of the detuning circuit do not affect the flexibility of the antenna loop.

In an embodiment, the detuning circuit may have at least one switching element or at least one series connection composed of at least one switching element and at least one inductance coil. In this case, the switching element may be configured, (e.g., as a pin diode), as a transistor, (e.g., as a field effect transistor), or as a microelectromechanical switch (MEMS switch). During reception via the local coil, the switching element is open so that the antenna loop may be operated at its intended resonance frequency. During transmission via a body coil, the switching element may be closed so that the resonance frequency of the antenna loop changes and therefore less power is transferred to the antenna loop or the body coil. For the purpose of changing the resonance frequency in this case, e.g., an inductance coil connected in series with the switching element may be used, the inductance coil being connected into the antenna loop when the switching element is closed. It is also possible to deploy solely a switching element if the antenna loop or the coaxial cable is dimensioned in such a way that, due to the coupling of the internal conductor and the external conductor or individual segments of the internal conductor and the external conductor when the switching element is closed, adequate detuning of the antenna loop is already produced.

A switching element that is embodied as a pin diode, transistor, or MEMS switch may be actively injected with current or activated via least one control interface, so that it is closed during transmission by a body coil and open when receiving via the local coil. The switching of the switching element may be effected, e.g., via a magnetic resonance imaging facility connected to the local coil.

A further, passive detuning circuit may be connected in parallel with the detuning circuit. In this case, the passive detuning circuit may include a passive switching element embodied as a pin diode. During transmission by a body coil, a comparatively high voltage is induced in the antenna such that the pin diode becomes conductive, and the inductance coil therefore switches into the antenna loop. As a result of this, the resonance frequency of the antenna loop changes and therefore less power is transferred to the antenna or the local coil. Only smaller voltages are generated in the local coil when receiving, and therefore the pin diode is not conductive, and the antenna may be operated at its intended resonance frequency.

As a result of arranging the detuning circuit in the electrical circuit arrangement, the inductance coil may be structurally small because less heat is generated in the detuning circuit when an excitation signal is received. In particular, the deployment of large high-quality air-core coils in the detuning circuit may therefore be avoided. The value of the inductance of the detuning circuit may be selected such that a minimum current is induced in the antenna coil during a transmission by the body coil.

For the purpose of adapting the resonance frequency, the electrical circuit arrangement may have at least one adaptation element connected to the internal conductor and/or the external conductor at the ends of the coaxial cable for the purpose of adapting a resonance frequency of the antenna loop. The adaptation element may be embodied as a capacitor or an inductance coil, for example, and change the resonance frequency of the antenna, the resonance frequency being determined by the coaxial cable and, in particular, by the interruptions of the internal conductor and/or external conductor, such that the resonance frequency may be precisely configured to the frequency of the magnetic resonance imaging. As a result of arranging the adaptation element as part of the electrical circuit, the flexibility of the antenna loop is moreover not adversely affected. In comparison with the integrated capacitors formed by the interruptions, an adaptation element designed as a capacitor represents a concentrated capacitor, e.g., embodied as an SMD component.

The detuning circuit and/or the at least one adaptation element may be connected to the external conductor at one end of the coaxial cable and to the internal conductor at the other end if the number of interruptions is even. Further, the detuning circuit and/or the at least one adaptation element may be connected to the external conductor or the internal conductor at both ends of the coaxial cable if the number of interruptions is odd.

In this way, a closed current circuit of the antenna conductor loop is obtained in each case for the purpose of receiving AC signals, containing in each case the capacitances created by the interruptions. If the number of interruptions is even, the detuning circuit may be connected to an internal conductor at a first end of the coaxial cable and to the external conductor at a second end of the coaxial cable, for example. An optional additional adaptation element may be correspondingly connected to the external conductor at the first end and to the internal conductor at the second end, such that a simple and compact structure of the electrical circuit arrangement may be achieved.

If the number of interruptions is odd, the detuning circuit may be correspondingly connected to the internal conductor at both ends of the coaxial cable and an optional adaptation element may be connected to the external conductor of the coaxial cable at both ends. Conversely, the detuning circuit may also be connected to the external conductor at both ends and an optional adaptation element to the internal conductor at both ends of the coaxial cable.

In an embodiment, the coaxial cable may have a diameter in a range of 1 mm and 3 mm and/or for the coaxial cable to have an impedance in a range of 50 Ohms and 120 Ohms and/or for the antenna loop to have a diameter in a range of 3 cm and 30 cm. By embodying the coaxial cable with a diameter or thickness in a range of 0.5 mm and 3 mm, adequate flexibility of the coaxial cable is achieved so that the whole local coil may be molded to various parts of a patient. The impedance of the coaxial cable may be in a range of 50 Ohms and 120 Ohms, (e.g., 75 Ohms). The diameter of the loop may be in a range of 3 cm and 30 cm, or in a range of 8 cm and 25 cm. It may be possible to deploy diameters of various sizes in order to control and in particular limit the influence of the local coil on imaging performed in parallel. When examining body parts of various sizes, one local coil which is configured to the respective size of the body part or a plurality of smaller local coils may be used in this case.

The coaxial cable may be attached to a flexible support element. In this way, even when the local coil is configured to a body part of a patient, it is possible to prevent the shape of the antenna from deviating more than necessary from its undistorted state in the substantially annular configuration. The flexible support element may be e.g. a nonwoven fabric or a material to which the coaxial cable is attached, e.g., by stitching. The electrical circuit arrangement or a support element holding the electrical circuit arrangement may also be connected or attached to the flexible support element.

BRIEF DESCRIPTION OF THE DRAWINGS

Further advantages and details of the present disclosure are derived from the exemplary embodiments described below and with reference to the drawings, specifically schematic illustrations, in which.

DETAILED DESCRIPTION

Figure 1:
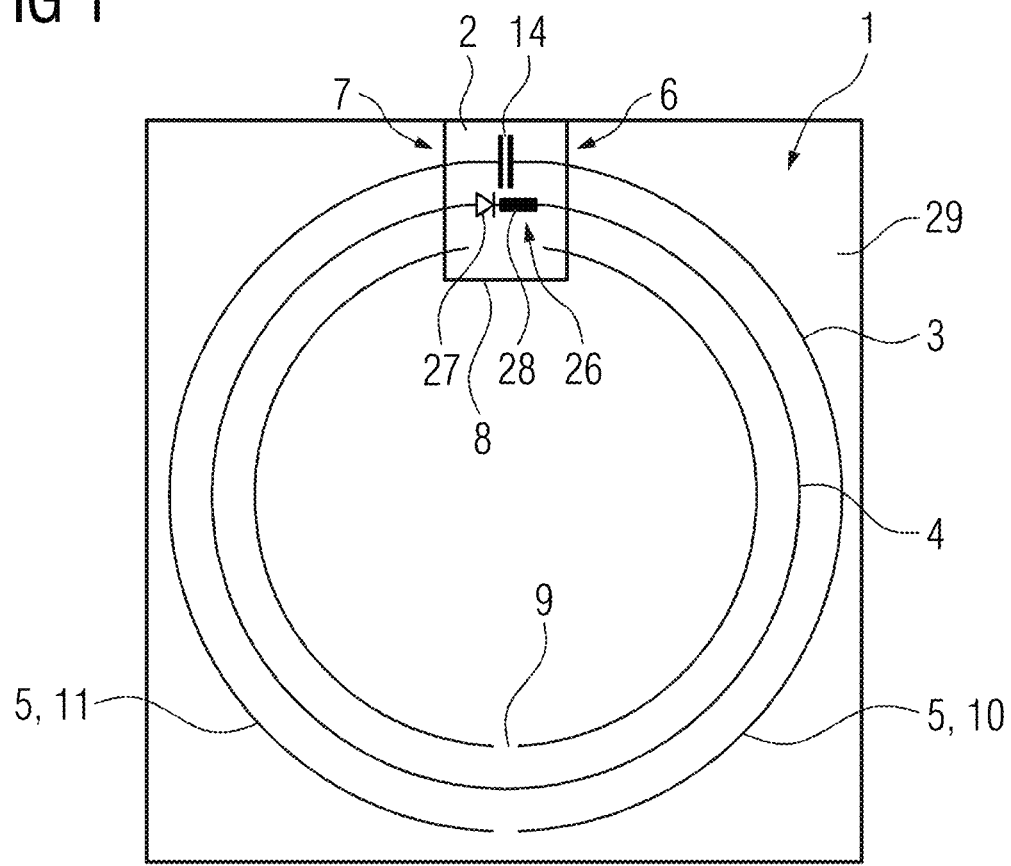
FIG. 1 depicts a first exemplary embodiment of a local coil.

FIG. 1 illustrates a first exemplary embodiment of a local coil 1. The local coil 1 includes an electrical circuit arrangement 2 and a coaxial cable 3 with an internal conductor 4 and an external conductor 5 which surrounds the internal conductor 4. The coaxial cable 3 is arranged in an annular manner, a first end 6 of the coaxial cable and a second end 7 of the coaxial cable being connected to the electrical circuit arrangement 2.

The electrical circuit arrangement 2 is arranged on a rigid support element 8, the ends 6, 7 of the coaxial cable 3 being attached to the support element 8. Opposite the electrical circuit arrangement 2, the external conductor 5 of the coaxial cable 3 has an interruption 9 such that the sections between both the first end 6 and the second end 7 of the coaxial cable 3 at the electrical circuit arrangement 2 and the interruption 9 of the external conductor 5 are each at least substantially equal in length. The external conductor 5, which is embodied as, (e.g., a conductive braided shield), is interrupted annularly along the circumference of the coaxial cable in this case, such that the external conductor 5 is divided into a first segment 10 and a second segment 11 and there is no direct electrical connection between the segments 10, 11 of the external conductor 5 in the region of the interruption 9.

The coaxial cable 3 forms an antenna loop of the local coil 1, the antenna loop being formed by both the internal conductor 4 and the external conductor 5. Starting from the electrical circuit arrangement 2, the antenna loop extends over the first segment 10 of the external conductor 5, the internal conductor 4, and the second segment 11 of the external conductor 5. In this case, a capacitance or an integrated capacitor of the antenna loop is formed between the first segment 10 of the external conductor 5 and the internal conductor 4 and between the internal conductor 4 and the second segment 11 of the external conductor 5. Contacting of the antenna loop or connection of the local coil 1 to further devices may be effected via connection interfaces (not illustrated) of the electrical circuit arrangement 2.

Figure 2:
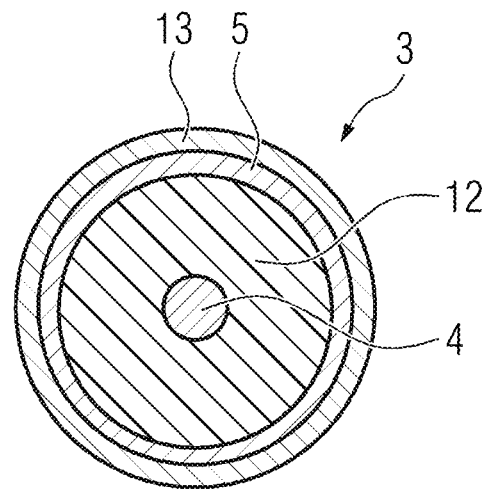
FIG. 2 depicts a cross section of a coaxial cable of the local coil.

FIG. 2 illustrates a cross section of the coaxial cable 3. It may be seen that, in addition to the internal conductor 4 and the external conductor 5, the coaxial cable 3 also includes a dielectric 12 arranged between the internal conductor 4 and the external conductor 5. The external conductor 5 is externally covered by a sheath 13 of the coaxial cable 3.

The interruption 9 of the external conductor 5, as illustrated in FIG. 1, results in the formation of two capacitances, each of which extends as an integrated capacitor of the coaxial cable 3 between the segments 10, 11 of the external conductor 5 and the internal conductor 4 via the dielectric 12. By the capacitances, the resonance frequency of the antenna loop that is formed by the coaxial cable 3 may be adapted. In this case, the resonance frequency is configured to the frequency of the magnetic resonance imaging for which the local coil 1 will be deployed.

In order to allow the resonance frequency of the antenna loop of the local coil 1 to be precisely adapted, the electrical circuit arrangement 2 further includes an adaptation element 14, embodied here as a capacitor, (e.g., an SMD capacitor). By virtue of the capacitance of the adaptation element 14 in the form of a capacitor, the resonance frequency of the antenna loop of the local coil 1 may be configured precisely to the required frequency of the magnetic resonance imaging. The adaptation element 14 is connected to the external conductor 5 or to the segments 10 and 11 of the external conductor 5 at the first end 6 and the second end 7, respectively.

In order to prevent the coupling of excessive powers into the local coil 1 during transmission by the coil of a magnetic resonance imaging facility, the electrical circuit arrangement 2 also includes a detuning circuit 26 including a series connection of a switching element 27 embodied as a pin diode and an inductance coil 28. The detuning circuit 26 is connected to the internal conductor 4 at both the first end 6 and the second end 7 of the coaxial cable 3. When strong excitation signals are received, e.g., from a body coil of a magnetic resonance imaging facility in a TX phase, the switching element 27 is switched to conduct so that the resonance frequency of the body coil 1 is changed by the inductance coil that is connected into the antenna loop. This reduces the transmit power transferred to the local coil 1 during transmission by the body coil and therefore reduces not only any heating of the local coil 1 but also the influence of the local coil 1 on the transmission procedure of the body coil. During reception, (e.g., when measuring signals are received by the local coil 1), the switching element 27 is switched to block so that the local coil 1 or the antenna loop may be operated at its predetermined resonance frequency.

The switching element 27 in the form of a pin diode may be switched to conduct or block by the application of a voltage. Alternatively, the switching element 27 may be embodied as a transistor, (e.g., a field effect transistor), or as a MEMS switch. The switching element may have at least one control interface (not illustrated here), via which the switching element 27 may be switched. The switching element 27 may also be connected via the control interface to a magnetic resonance imaging facility, for example.

The arrangement of the detuning circuit 26 as part of the electrical circuit 2 allows the inductance coil 28 to be comparatively small. Measurements have shown that during transmission by a body coil of the magnetic resonance imaging facility, only a small leakage power is generated in the detuning circuit 26 that is arranged as part of the electrical circuit arrangement 2. The heating of the detuning circuit 26 is thereby reduced, such that the inductance coil 28 may advantageously also be structurally small. The embodiment of the support element 8 of the electrical circuit arrangement 2 may therefore likewise be small. The same applies to a housing (not illustrated here), which surrounds the electrical circuit arrangement 2. The value of the inductance coil is selected in particular such that a small current flow is produced in the antenna loop during the transmit phase of the body coil. The inductance coil is advantageously selected in such a way that a surface temperature of the local coil 1, (e.g., resulting from heating of the detuning circuit 26 and the coaxial cable 3), remains below 40° C., in particular at a housing which surrounds the electrical circuit arrangement 2.

The local coil 1 further includes a flexible support element 29 to which the coaxial cable 3 is attached. The flexible support element 29 may be embodied as a nonwoven fabric or a material, wherein the attachment of the coaxial cable 3 and/or the electrical circuit arrangement 2 to the nonwoven fabric may be effected by stitching.

In order to adapt the local coil 1 for high magnetic flux densities, (e.g., 3 T or more), and in this way to avoid particularly small capacitance values for an adaptation element 14 designed as a capacitor, provision may be made in addition to the interruption 9 of the external conductor 5 for further interruptions 9 of the external conductor 5 and/or further interruptions of the internal conductor 4.

Figure 3:
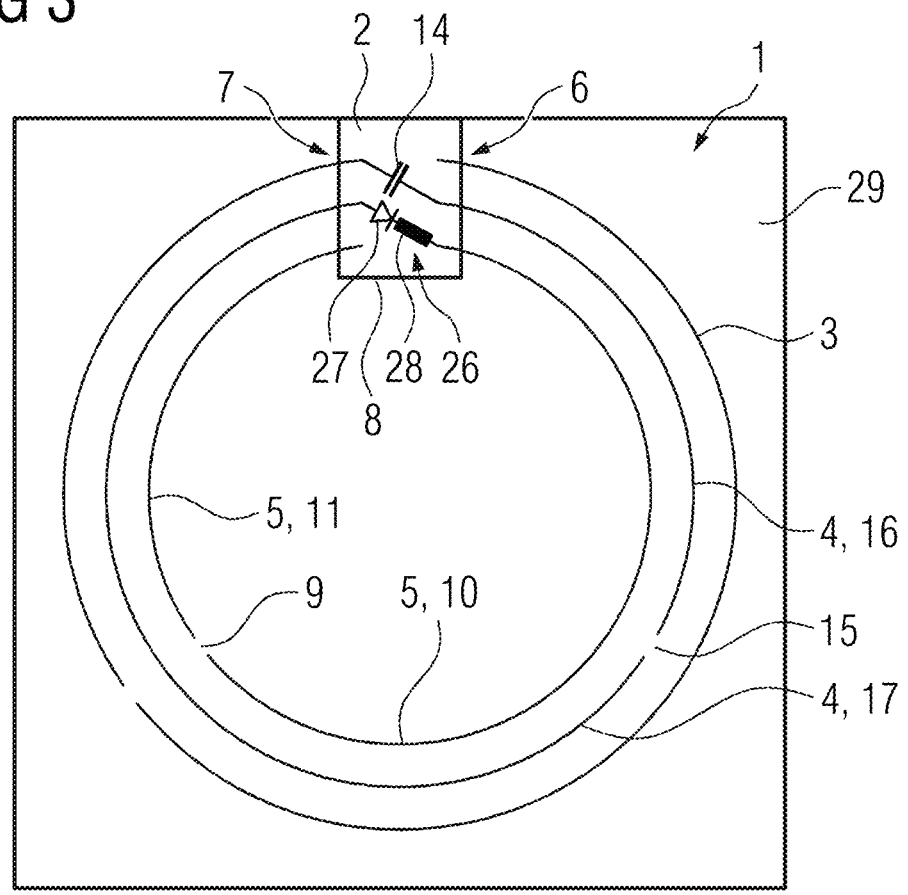
FIG. 3 depicts a second exemplary embodiment of a local coil.

FIG. 3 illustrates a second exemplary embodiment of a local coil 1. In this exemplary embodiment, the external conductor 5 includes an interruption 9 as previously described. Furthermore, the internal conductor 4 also includes an interruption 15. The interruption 9 of the external conductor 5 and the interruption 15 of the internal conductor 4 are arranged along the coaxial cable 3 in such a way that the sections between the electrical circuit arrangement 2 and the interruption 15 of the internal conductor 4, between the electrical circuit arrangement 2 and the interruption 9 of the external conductor 5, and between the interruption 9 and the interruption 15 are at least substantially equal in length in each case. The positions of the interruptions 9, 15 therefore divide the coaxial cable 3 into three sections of substantially equal length. It is also possible to select different lengths for the sections in order to further influence the resonance frequency of the local coil 1 via the position of the interruptions 9, 15.

However, the use of sections of at least substantially equal length has the advantage that the antenna formed by the coaxial cable 3 is symmetrically loaded when receiving via the local coil 1, such that in particular a symmetrical voltage or a symmetrical current is induced in the antenna loop.

As a result of the interruption 15 of the internal conductor 4, the internal conductor 4 is divided into a first segment 16 and a second segment 17. Starting from the first end 6 of the coaxial cable 3 at the electrical circuit arrangement 2, the antenna loop therefore extends via the first segment 16 of the internal conductor 4, the capacitance formed between the first segment 16 of the internal conductor 4 and the first segment 10 of the external conductor 5, and via the first segment 10 of the external conductor 5. From here, the antenna loop runs via the capacitance between the first segment 10 of the external conductor 5 and the second segment 17 of the internal conductor 4 to the second segment 17 of the internal conductor 4, and via the capacitance between the second segment 17 of the internal conductor 4 and the second segment 11 of the external conductor 5 to the second segment 11 of the external conductor 5, from where the antenna loop is closed by the adaptation element 14.

Because the number of interruptions 9, 15 is even in this exemplary embodiment, the adaptation element 14 is connected to the internal conductor 4 at the first end 6 of the coaxial cable 3 and to the external conductor 5 at the second end 7 of the coaxial cable 3, such that overall an antenna loop is produced with three capacitances connected in series. The detuning circuit 26 is connected to the external conductor 5 at the first end 6 of the coaxial cable 3 and to the internal conductor 4 at the second end 7 of the coaxial cable 3.

Figure 4:
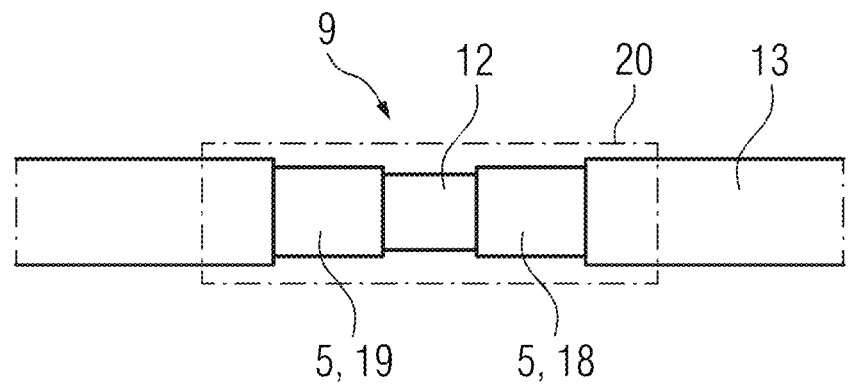
FIG. 4 depicts a first detail view of a local coil.

FIG. 4 illustrates a detail view of an interruption 9 of the external conductor 5 of a local coil 1. The interruption 9 of the external conductor 5 may be effected by interrupting the sheath 13 of the coaxial cable 3, the end sections 18, 19 of the external conductor 5 being surrounded by an insulation material 20, shown as transparent here, in the region of the interruption of the sheath 13. The insulation material 20 may be embodied as a heat-shrinkable tube, for example. Neither the dielectric 12 within the external conductor 5 nor the internal conductor 4 are interrupted in the region of the interruption 9 of the external conductor 5. In this way, an interruption of the external conductor 5 may be created with little effort during the manufacture of the local coil 1. Moreover, the flexibility of the coaxial cable 3 and therefore the adaptability of arrangement of the local coil 1 are not significantly influenced as a result of the embodiment of the interruption 5 illustrated here.

Figure 5:
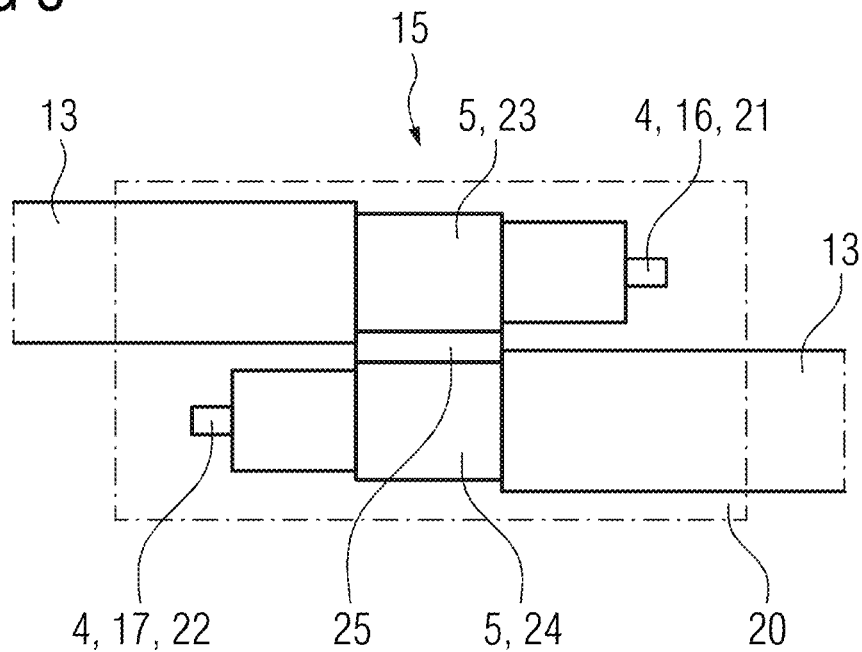
FIG. 5 depicts a second detail view of a local coil.

FIG. 5 illustrates an interruption 15 of the internal conductor 4 in a detail view of a local coil 1. In the region of the interruption 15 of the internal conductor 4, the end sections 21, 22 of the internal conductor 4 created by the interruption 15 run sectionally parallel. The sections 23, 24 of the external conductor 5 surrounding the segments 16, 17 of the internal conductor 4 are connected together electrically in the region of the interruption 15. For this purpose, a soldered connection 25 may be created, (e.g., between the sections 23, 24 of the external conductor 5), thereby producing a direct electrical connection of the sections 23, 24 of the external conductor 5. There is consequently no interruption of the external conductor 5 in the region of the interruption 15 of the internal conductor 4. The interruption 15 of the internal conductor 4 may likewise be surrounded by the insulation material 20, shown as transparent here, which is embodied as a heat-shrinkable tube, for example.

An interruption 15 of the internal conductor 4 configured in this way does not significantly influence the flexibility of the coaxial cable. This makes it possible in particular, even with a larger number of interruptions 15 of the internal conductor 4 or a larger number of interruptions 9 of the external conductor 5, to maintain a high flexibility of the coaxial cable 3 and therefore the antenna of the local coil 1.

Figure 6:
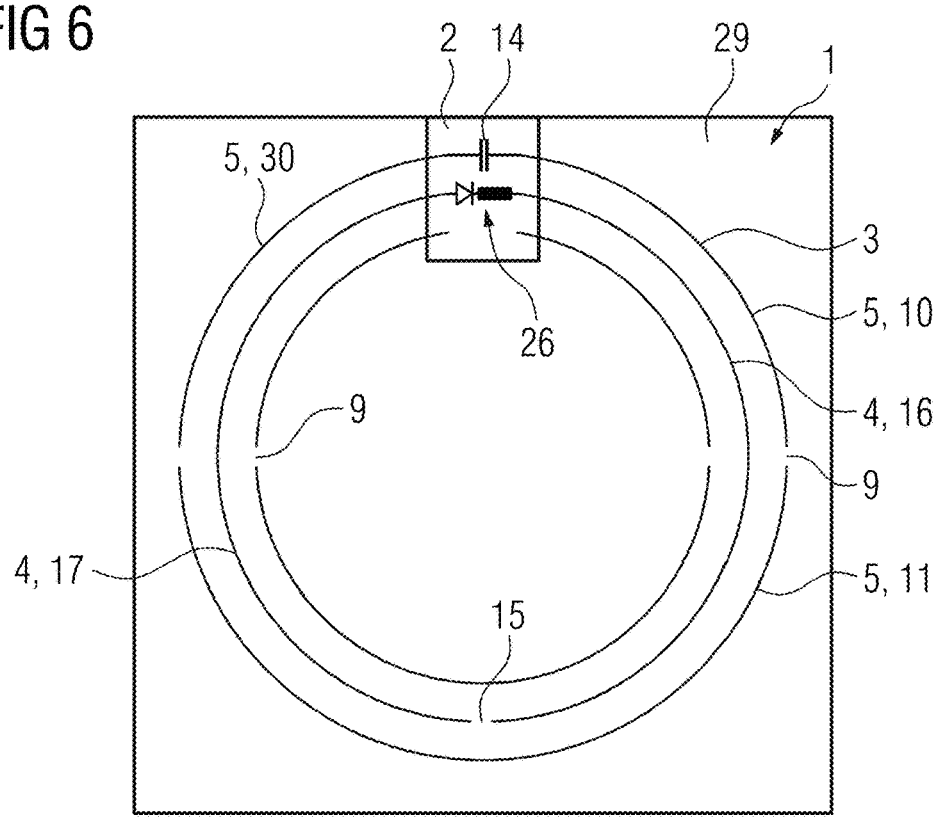
FIG. 6 depicts a third exemplary embodiment of a local coil.

FIG. 6 illustrates a third exemplary embodiment of a local coil 1. In this exemplary embodiment, the coaxial cable 3 includes four integrated capacitors, for which purpose one interruption 15 of the internal conductor 4 and two interruptions 9 of the external conductor 5 are provided. In order to close the antenna loop in the electrical circuit arrangement 2, the adaptation element 14 is connected to the external conductor 5 at both the first end 6 and the second end 7 of the coaxial cable. The detuning circuit 26 is connected to the internal conductor 4 or the segments 16, 17 of the internal conductor 4 at both the first end 6 and the second end 7. Alternatively, the detuning circuit 26 may also be connected to the external conductor 5 at both ends 6, 7 and the adaptation element 14 to the internal conductor 4 at both ends 6, 7.

Figure 7:
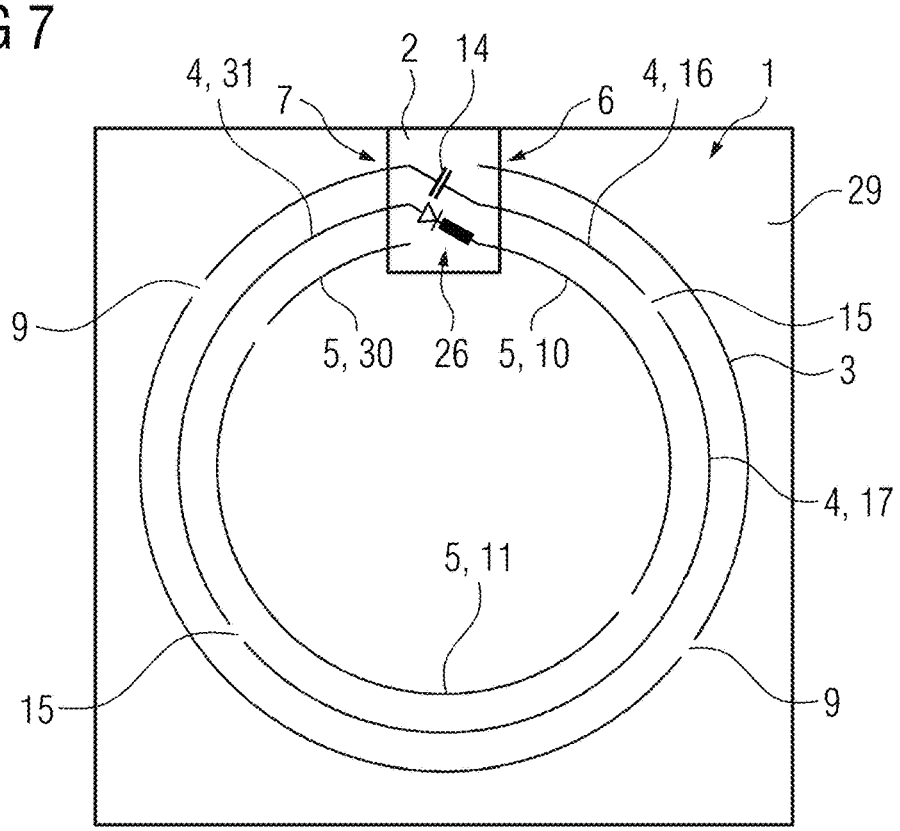
FIG. 7 depicts a fourth exemplary embodiment of a local coil.

FIG. 7 illustrates a fourth exemplary embodiment of a local coil 1. This differs from the previously described exemplary embodiments in that the antenna loop formed by the coaxial cable 3 has a total of five integrated capacitors, to which end the internal conductor 4 and the external conductor 5 each have two interruptions 9 and 15 respectively. As a result of the even number of interruptions 9, 15 in the coaxial cable 3, the adaptation element 14 is arranged as per the first exemplary embodiment of the local coil 1. The detuning circuit 26 is likewise so arranged as to be connected to the external conductor 5 at the first end 6 of the coaxial cable 3 and to a third segment 31 of the internal conductor 4 at the second end 7 of the coaxial cable 3.

In all exemplary embodiments, the coaxial cable may have a diameter between 0.5 mm and 3 mm. A good flexibility of the coaxial cable is achieved thereby. Furthermore, the coaxial cable in all exemplary embodiments may have an impedance between 50 Ohms and 120 Ohms inclusive, e.g. 75 Ohms. It is possible in all exemplary embodiments for the electrical circuit arrangement 2 to have further components, e.g., a preamplifier.

The diameter of the antenna loop formed by the coaxial cable 3 may be in a range of 3 cm and 30 cm, or in a range of 8 cm and 25 cm, in all exemplary embodiments. As illustrated above, the internal conductor 4 and/or the external conductor 5 may also have more than two interruptions in each case. In particular, provision may be made for 1 to 10 interruptions, (e.g., 3 to 5 interruptions), of the internal conductor 4 and/or the external conductor 5. In each case, the interruptions 9, 15 are in particular arranged in such a way that the sections of the coaxial cable 3 between the electrical circuit arrangement 2 and an adjacent interruption 9, 15 are at least substantially equal in length to the sections between two adjacent interruptions 9, 15.

In all exemplary embodiments, a further, passive detuning circuit may be connected in parallel with the detuning circuit 26. The further detuning circuit in this case may have a pin diode as a passive switching element which is switched to conduct by a voltage that is induced in the antenna loop during transmission by a body coil and thereby causes detuning of the antenna loop, in particular, by an inductance coil that is connected in series with the pin diode. When receiving, the pin diode is then switched to block due to the lower induced voltages, and therefore the antenna loop may be operated at the intended impedance.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

Although the disclosure is illustrated and described in detail with reference to various embodiments, the disclosure is not restricted to the examples disclosed above and other variations may be derived therefrom by a person skilled in the art without departing from the scope of the disclosure. It is therefore intended that the foregoing description be regarded as illustrative rather than limiting, and that it be understood that all equivalents and/or combinations of embodiments are intended to be included in this description.

The invention claimed is:

1. A local coil for magnetic resonance imaging, the local coil comprising:
   an electrical circuit arrangement; and
   a coaxial cable with an internal conductor and an external conductor surrounding the internal conductor,
   wherein two ends of the coaxial cable are connected to the electrical circuit arrangement and the internal conductor and the external conductor together form an antenna loop,
   wherein at least one of the internal conductor or the external conductor has at least one interruption,
   wherein the at least one interruption divides the internal conductor and/or the external conductor into at least two separate segments in each case,
   wherein a sheath of the coaxial cable is interrupted in a region of an interruption of the external conductor, and
   wherein end sections of segments of the external conductor created by the interruption of the external conductor are surrounded by an insulation material in the region of an interruption of the sheath.

2. The local coil of claim 1, wherein the internal conductor and the external conductor each have an interruption or a plurality of interruptions,
   wherein a number of interruptions of the internal conductor and a number of interruptions of the external conductor are equal or differ by one.

3. The local coil of claim 2, wherein sections of the coaxial cable between the electrical circuit arrangement and at least one adjacent interruption are at least substantially equal in length, and/or wherein a section or sections of the coaxial cable between two adjacent interruptions are at least substantially equal in length.

4. The local coil of claim 2, wherein the external conductor and the internal conductor have 1 to 10 interruptions in total.

5. The local coil of claim 2, wherein, in a region of the interruption of the internal conductor, adjacent end sections of segments of the internal conductor created by the interruption of the internal conductor run at least sectionally parallel, and wherein sections of the external conductor surrounding the segments of the internal conductor having the interruption are electrically connected, therein providing no interruption of the external conductor in the region of the interruption of the internal conductor.

6. The local coil of claim 1, wherein sections of the coaxial cable between the electrical circuit arrangement and at least one adjacent interruption are at least substantially equal in length, and/or wherein a section or sections of the coaxial cable between two adjacent interruptions are at least substantially equal in length.

7. The local coil of claim 1, wherein the external conductor and the internal conductor have 1 to 10 interruptions in total.

8. The local coil of claim 1, wherein the electrical circuit arrangement has at least one detuning circuit connected to the internal conductor and/or to the external conductor at the ends of the coaxial cable.

9. The local coil of claim 8, wherein the at least one detuning circuit has at least one switching element or at least one series connection composed of the at least one switching element and at least one inductance coil.

10. The local coil of claim 8, wherein the at least one detuning circuit is connected to the external conductor at one end of the coaxial cable and to the internal conductor at the other end when a number of interruptions is even, or wherein the at least one detuning circuit is connected to the external conductor or to the internal conductor at both ends of the coaxial cable when the number of interruptions is odd.

11. The local coil of claim 1, wherein the electrical circuit arrangement has at least one adaptation element connected to the internal conductor and/or to the external conductor at the ends of the coaxial cable, and wherein the at least one adaptation element is configured to adapt a resonance frequency of the antenna loop.

12. The local coil of claim 11, wherein the at least one adaptation element is connected to the external conductor at one end of the coaxial cable and to the internal conductor at the other end when a number of interruptions is even, or wherein the at least one adaptation element is connected to the external conductor or to the internal conductor at both ends of the coaxial cable when the number of interruptions is odd.

13. The local coil of claim 1, wherein the coaxial cable has a diameter in a range of 0.5 mm and 3 mm, wherein the coaxial cable has an impedance in a range of 50 Ohms and 120 Ohms, wherein the antenna loop has a diameter in a range of 3 cm and 30 cm, or a combination thereof.

14. The local coil of claim 1, wherein the coaxial cable is attached to a flexible support element.

15. A local coil for magnetic resonance imaging, the local coil comprising:

an electrical circuit arrangement, and a coaxial cable with an internal conductor and an external conductor surrounding the internal conductor, wherein two ends of the coaxial cable are connected to the electrical circuit arrangement and the internal conductor and the external conductor together form an antenna loop, wherein the internal conductor has an interruption, wherein the interruption divides the internal conductor and the external conductor into two separate segments in each case, wherein, in a region of the interruption of the internal conductor, adjacent end sections of the two separate segments of the internal conductor created by the interruption of the internal conductor run at least sectionally parallel to each other in a circumferential direction of the antenna loop, and wherein sections of the external conductor surrounding the segments of the internal conductor having the interruption are electrically connected, therein providing no interruption of the external conductor in the region of the interruption of the internal conductor.

* * * * *